United States Patent [19]

Croset

[11] 3,826,956

[45] July 30, 1974

[54] INTERCONNECTION FOR INTEGRATED UHF ARRANGEMENTS

[75] Inventor: Michel Croset, Paris, France

[73] Assignee: Sescosem-Societe Europeenne de Semiconducteurs et de Microelectronique, Paris, France

[22] Filed: May 31, 1972

[21] Appl. No.: 258,441

[30] Foreign Application Priority Data

June 9, 1971 France ............................ 71.20940

[52] U.S. Cl. ..... 317/234 R, 317/234 M, 317/234 N

[51] Int. Cl. ............................................ H01l 5/00

[58] Field of Search .................................. 317/234

[56] References Cited

UNITED STATES PATENTS

| | | | |
|---|---|---|---|
| 3,256,588 | 6/1966 | Sikina et al. | 29/155.5 |
| 3,559,003 | 1/1971 | Beaudouin et al. | 317/234 |
| 3,569,796 | 3/1971 | Mulford | 317/234 |
| 3,609,294 | 9/1971 | Cady et al. | 219/216 |

*Primary Examiner*—Rudolph V. Rolinec
*Assistant Examiner*—E. Wojciechowicz
*Attorney, Agent, or Firm*—Cushman, Darby & Cushman

[57] ABSTRACT

An interconnection system circuit integrated on the same substrate comprises: ohmic contacts made by a layer of zirconium or tantalum which ensures resistive contact and overlaid with a layer of aluminum.

The interconnections are effected by two superimposed layers of zirconium or tantalum and of aluminium and the resistors are made by the exposed zirconium or tantalum.

5 Claims, 5 Drawing Figures

INTERCONNECTION FOR INTEGRATED UHF ARRANGEMENTS

The object of the invention is a new type of interconnection for integrated UHF arrangements.

Two critical difficulties are involved in the construction of such interconnections.

The contact resistance between the connection and the active element in a solid state must be reduced to a minimum.

To solve this problem, the semiconductor-metal arrangement is generally annealed; however, during the annealing operation, there is a danger that the metal may be diffused in the element, resulting in a short-circuit in the element. To overcome this drawback, an intermediate layer, consisting of a stable metal, such as palladium of platinum, is introduced between the connection and the active element. This is costly and difficult.

A further problem resides in the construction of stable balance resistors. These generally consist of thin layers of a metal which is necessarily of a different nature from that of the metal ensuring contact, since it must have a high resistivity.

The present invention makes it possible to solve both these problems at one and the same time.

According to the invention there are provided interconnection system for circuits integrated on the same semiconductive substrate, comprising a plurality of active elements, and ohmic contact to each active elements, and interconnections and interconnection resistors between said elements; each ohmic contact comprising two superimposed layers, the first of which being made of a metal having a high resistivity and selectively attackable by predetermined chemical agents, for selectively interrupting connection paths between said elements, the second being made of a second metal, capable of protecting said first metal against said agents, and having a low resistivity, and said interconnection resistors being made by a layer of said first metal, and said interconnections, by two superimposed layers of said first and said second metal.

The invention will be better understand with the help of the following description and the attached drawings, FIGS. 1 to 5 of which show a cross section of an active element during the various stages of manufacture of its interconnections.

Figure 1:
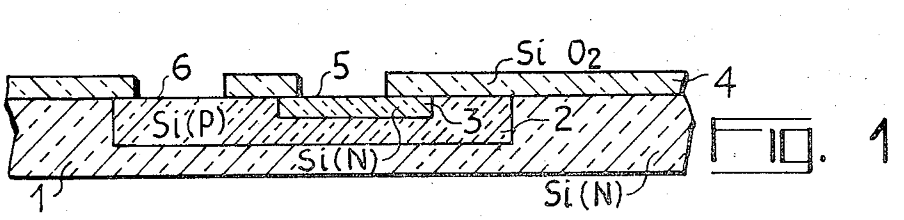

FIG. 1 illustrates a transistor of the planar type, comprising a collector 1, made up of a substrate of n-type doped silicon. A base 2 of p-type doped silicon and an n-type doped emitter 3 are diffused in this substrate in the conventional manner.

The whole has been overlaid by a layer 4 of silica $SiO_2$, in which windows 5 and 6 have been opened, thus exposing parts of the base and the emitter.

The following figures show how the invention enables the ohmic contacts on the base and the emitter and the interconnection resistances to be effected.

Figure 2:
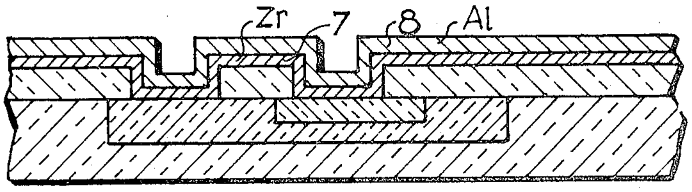

In FIG. 2, upon the assembly, have been deposited in succession a layer 7 of zirconium and a layer 8 of aluminium. Subsequently, the aluminium will be used to make the low-resistance interconnections and the zirconium the resistors.

Figure 3:
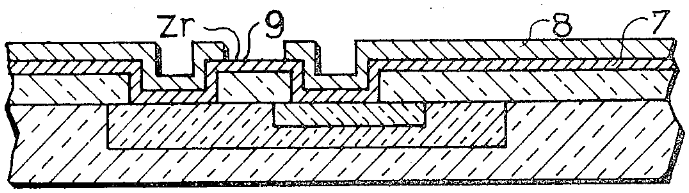

In FIG. 3, the zirconium has been etched by acid, for example, thereby layed bare over the area of the layer of $SiO_2$, which normally ensures base-emitter insulation.

Figure 4:
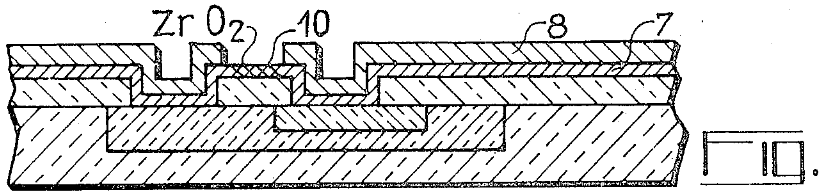

In FIG. 4, as a consequence of an appropriate thermal treatment, the zirconium is oxidized in the area 9 and replaced by a layer of zirconium dioxide $ZrO_2$,10.

Insulation between base and emitter is thus re-established. The thermal treatment is, for instance, an oxidizing process at 400° C in an oxigen atmosphere. This operation may be substituted by any other which enables the exposed zirconium (chemical etching, crushing, etc.) to be eliminated.

Figure 5:
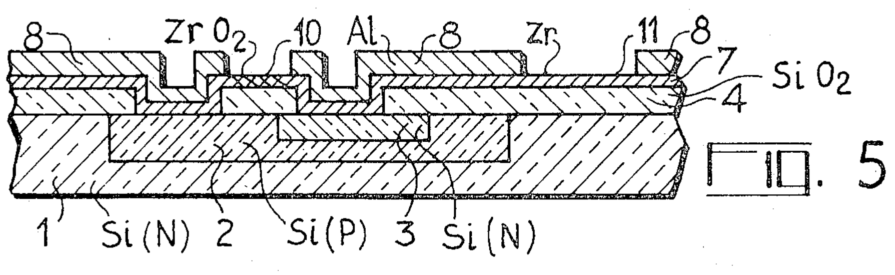

In FIG. 5, as a result of localised etching, the aluminium is removed from an area 11, laying bare the zirconium; the exposed zirconium will be the metal with which the resistors are constructed.

The embodiment has, of course, been chosen as a non-restrictive example. It is possible to select any metal with a high specific resistance, which provides a resistive contact with the semiconductor and which can be oxidized in situ by appropriate heat treatment. Tantalum and hafnium may be suggested.

What I claim is:

1. Interconnection system for circuits integrated on the same semiconductive substrate, comprising a plurality of active elements, and ohmic contacts to each active elements, and interconnections and interconnection resistors between said elements; each ohmic contact comprising two superimposed layers, the first of which being made of a metal having a high resistivity and selectively attackable by predetermined chemical agents for selectively forming insulating areas interrupting connection paths between said elements, the second being made of a second metal, capable of protecting said first metal against said agents, and having a low resistivity, and said interconnection resistors being made by a layer of said first metal, and said interconnections, by two superimposed layers of said first and said second metal.

2. Interconnection system as claimed in claim 1, wherein said areas are made of one insulating compound of said metal.

3. Interconnection system as claimed in claim 2, wherein said compound is an oxide of said first metal.

4. Interconnection system as claimed in claim 1, wherein said agents are capable of etching and removing said first metal.

5. Interconnection system as claimed in claim 1, wherein said first metal is chosen in the group tantalum, hafnium, zirconium.

* * * * *